United States Patent
Kono et al.

(10) Patent No.: US 10,791,295 B2
(45) Date of Patent: Sep. 29, 2020

(54) PHOTOELECTRIC CONVERSION APPARATUS, IMAGING SYSTEM, AND MOVING BODY

(71) Applicant: CANON KABUSHIKI KAISHA, Tokyo (JP)

(72) Inventors: Shoji Kono, Hachioji (JP); Toru Koizumi, Yokohama (JP); Hiroo Akabori, Fujisawa (JP); Yusuke Yamashita, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/254,901

(22) Filed: Jan. 23, 2019

(65) Prior Publication Data
US 2019/0238774 A1  Aug. 1, 2019

(30) Foreign Application Priority Data
Jan. 26, 2018  (JP) .................................. 2018-011424

(51) Int. Cl.
*H04N 5/378* (2011.01)
*H04N 5/355* (2011.01)
(Continued)

(52) U.S. Cl.
CPC ............. *H04N 5/378* (2013.01); *H04N 5/343* (2013.01); *H04N 5/355* (2013.01); *H04N 5/36961* (2018.08); *H01L 27/14627* (2013.01)

(58) Field of Classification Search
CPC ......... H04N 5/23212; H04N 5/232122; H04N 5/343; H04N 5/355–3559; H04N 5/36961; H04N 5/36965; H04N 5/374; H04N 5/3741; H04N 5/3745; H04N 5/37455; H04N 5/378; H01L 27/14609; H01L 27/14612–14616; H01L 27/14613–14645
See application file for complete search history.

(56) References Cited

U.S. PATENT DOCUMENTS

| 2016/0198110 A1* | 7/2016 | Ikedo | H04N 5/3745 348/231.99 |
| 2017/0280083 A1* | 9/2017 | Otake | H04N 5/353 |
| 2018/0113278 A1* | 4/2018 | Ikeda | G02B 7/346 |

FOREIGN PATENT DOCUMENTS

| JP | 2001-250931 A | 9/2001 |
| JP | 2005-175517 A | 6/2005 |

* cited by examiner

*Primary Examiner* — Paul M Berardesca
(74) *Attorney, Agent, or Firm* — Canon U.S.A., Inc. IP Division

(57) ABSTRACT

A photoelectric conversion apparatus includes first and second signal lines, first and second circuits, and a switch. Signals based on electric charges generated in first and second photoelectric conversion portions are to be read out to the first and second signal lines, respectively. The first circuit includes a first input unit to which the first signal line is connected. The first circuit is configured to perform processing of a signal input to the first input unit, with a first gain. The second circuit includes a second input unit to which the second signal line is connected. The second circuit is configured to perform processing of a signal input to the second input unit. The switch is configured to perform switching between a connected state and a disconnected state between the first signal line and the second signal line.

20 Claims, 14 Drawing Sheets

(51) Int. Cl.
*H04N 5/343* (2011.01)
*H04N 5/369* (2011.01)
*H01L 27/146* (2006.01)

PHOTOELECTRIC CONVERSION APPARATUS, IMAGING SYSTEM, AND MOVING BODY

BACKGROUND OF THE INVENTION

Field of the Invention

One disclosed aspect of the embodiments relates to a photoelectric conversion apparatus.

Description of the Related Art

Japanese Patent Application Laid-Open No. 2005-175517 discusses a method for producing an output with a low gain and an output with a high gain in a pixel signal amplification unit, and expanding a dynamic range using signals of these two outputs. Japanese Patent Application Laid-Open No. 2001-250931 discusses a method for reading out a signal corresponding to each of a plurality of photoelectric conversion portions provided as one set. Japanese Patent Application Laid-Open No. 2001-250931 further describes a system that can perform both of ranging and imaging based on the signal corresponding to each of the plurality of photoelectric conversion portions.

Japanese Patent Application Laid-Open No. 2001-250931 discusses an idea of reading out a signal for ranging and a signal for imaging from the plurality of photoelectric conversion portions by selecting these signals, but discusses nothing about a specific configuration of a circuit for such readout.

SUMMARY OF THE INVENTION

One disclosed aspect of the embodiments is directed to a circuit arrangement that can easily change a signal readout method, in a photoelectric conversion apparatus having a plurality of photoelectric conversion portions.

According to an aspect of the embodiments, a photoelectric conversion apparatus includes first and second photoelectric conversion portions, first and second signal lines, first and second circuits, and a switch. First and second signals based on electric charges generated in the first and second photoelectric conversion portions, respectively, are to be read out to the first and second signal lines, respectively. The first circuit includes a first input unit to which the first signal line is connected. The first circuit is configured to perform processing of amplification and/or analog-to-digital (AD) conversion of a signal input to the first input unit, with a first gain. The second circuit includes a second input unit to which the second signal line is connected. The second circuit is configured to perform processing of amplification and/or AD conversion of a signal input to the second input unit, with a second gain different from the first gain. The switch is configured to perform switching between a connected state and a disconnected state between the first signal line and the second signal line.

According to another aspect of the embodiments, a system includes the photoelectric conversion apparatus described above, and a processing apparatus configured to process a signal output from the photoelectric conversion apparatus.

According to yet another aspect of the embodiments, a moving body includes the photoelectric conversion apparatus described above, a movement apparatus, a processing apparatus configured to acquire information from a signal output from the photoelectric conversion apparatus, and a control apparatus configured to control the movement apparatus based on the information.

Further features of the disclosure will become apparent from the following description of exemplary embodiments with reference to the attached drawings.

DESCRIPTION OF THE EMBODIMENTS (Photoelectric Conversion Apparatus)

Figure 1:
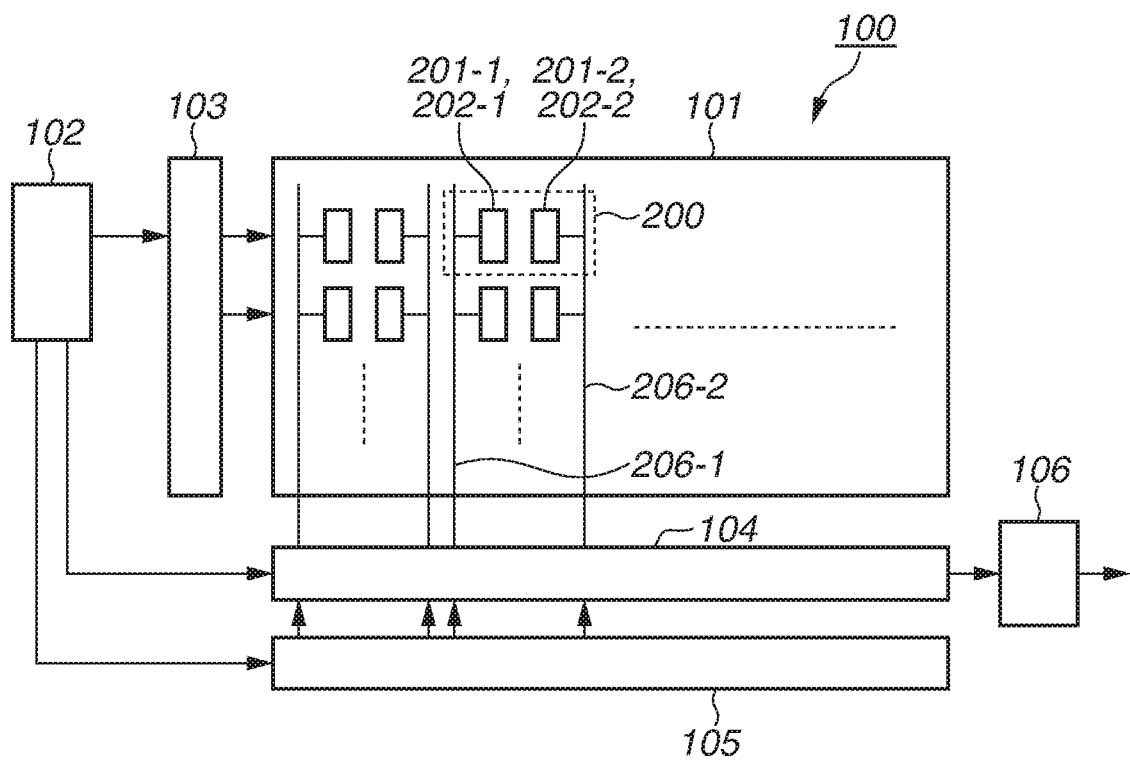
FIG. 1 is a block diagram illustrating a configuration of a photoelectric conversion apparatus according to a first exemplary embodiment.

FIG. 1 is a block diagram illustrating an example of a configuration of a photoelectric conversion apparatus according to a first exemplary embodiment. A photoelectric conversion apparatus 100 has a pixel area 101 in which a plurality of pixels 200 is arranged in a matrix (two-dimensionally). In FIG. 1, only four of the pixels 200 are illustrated for convenience of illustration. However, tens of millions or more pixels are arranged in an actual photoelectric conversion apparatus. In the present exemplary embodiment, the description will focus on photoelectric conversion portions 202-1 and 202-2. In this example, the one pixel 200 has the photoelectric conversion portions 202-1 and 202-2 as a plurality of photoelectric conversion portions (two in the present exemplary embodiment). In this example, the one pixel 200 has an amplification MOS transistors 201-1 and 201-2, and the amplification MOS transistors 201-1 and 201-2 are respectively connected to signal lines 206-1 and 206-2. The photoelectric conversion apparatus 100 further has a timing generator 102, a vertical scanning circuit 103, an analog amplifier 104, a horizontal scanning circuit 105, and a signal output circuit 106, as peripheral circuits of the pixel area 101. The photoelectric conversion apparatus 100 according to the present exemplary embodiment is a complementary metal oxide semiconductor (CMOS) image sensor.

Signals photoelectrically converted in the pixel area 101 are sequentially read out for each row by the vertical scanning circuit 103 controlled by the timing generator 102. The read-out signals are input to the analog amplifier 104 in which the signals are amplified. The amplified signals are sequentially input to the signal output circuit 106, by the horizontal scanning circuit 105 controlled by the timing generator 102. The signals are then subjected to processing such as noise subtraction processing in the signal output circuit 106, and then output to outside (e.g., an analog-to-digital (AD) converter) as an output of the photoelectric conversion apparatus 100.

(Pixel and Readout Circuit)

Figure 14A:
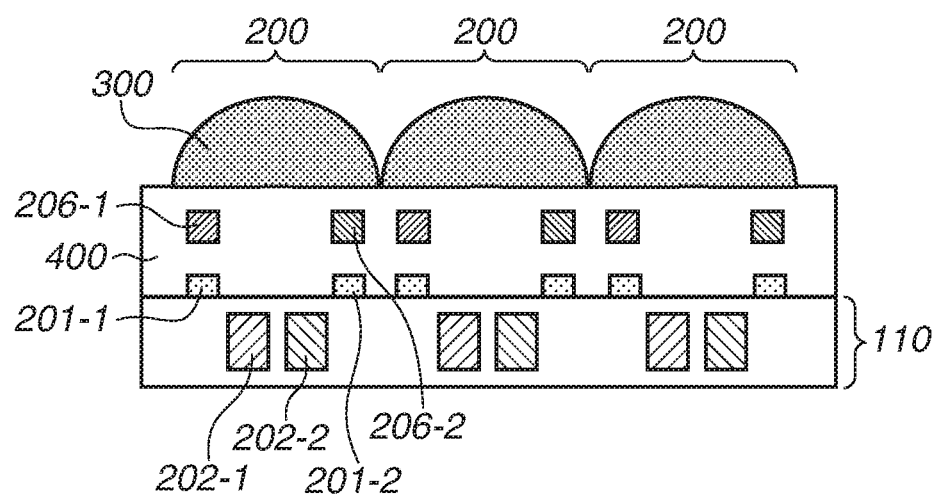
FIGS. 14A and 14B are each a schematic illustration of the photoelectric conversion apparatus according to the first exemplary embodiment.
Figure 14B:
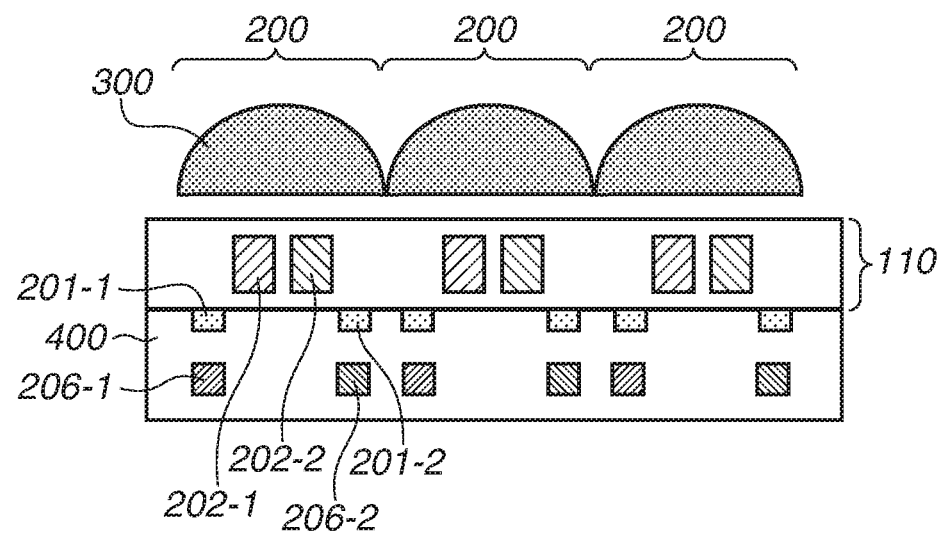

FIG. 14A and FIG. 14B are schematic illustrations of the photoelectric conversion apparatus 100. In the example FIG. 14A and FIG. 14B, photoelectric conversion portions 202-1 and 202-2 are arranged in a semiconductor layer 110. The semiconductor layer 110 is provided with the amplification MOS transistors 201-1 and 201-2. A wiring part 400 includes a conductor layer as a wiring layer and an interlayer insulator which are arranged above the semiconductor layer 110. In the example FIG. 14A and FIG. 14B, the interlayer insulator is not hatched. The signal lines 206-1 and 206-2 are included in the conductor layer of the wiring part 400. A part of the interlayer insulator of the wiring part 400 is arranged between the semiconductor layer 110 and the wiring layer of the wiring part 400. In the example FIG. 14A, the wiring part 400 is located between the microlens 300 and the two photoelectric conversion portions 202-1 and 202-2. However, in the example FIG. 14B, the two photoelectric conversion portions 202-1 and 202-2 may be located between the microlens 300 and the wiring part 400. Here, each of the pixels 200 in the pixel area 101 has the two photoelectric conversion portions 202-1 and 202-2. In the examples of FIGS. 14A and 14B, the two photoelectric conversion portions 202-1 and 202-2 share one microlens 300. Pupil division on light entering the photoelectric conversion apparatus 100 is thereby performed so that phase difference information necessary for autofocus (AF) can be obtained.

Figure 2:
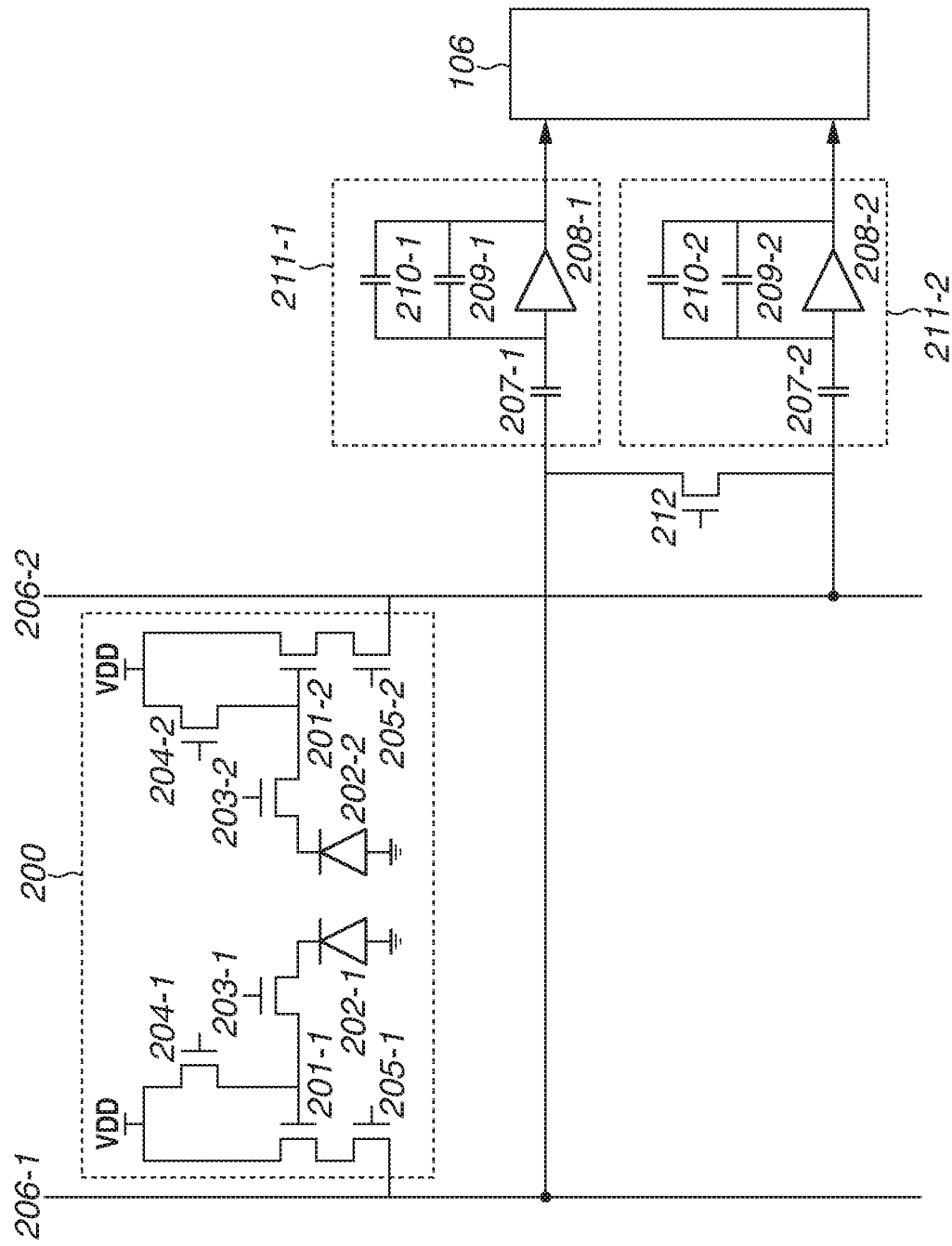
FIG. 2 is an equivalent circuit diagram illustrating a configuration of a pixel and a readout circuit, according to the first exemplary embodiment.

FIG. 2 illustrates a configuration of a pixel and a readout circuit, according to the first exemplary embodiment. A circuit arrangement to be described below is present for each of the two photoelectric conversion portions 202-1 and 202-2. However, because the circuit of the photoelectric conversion portion 202-1 and the circuit of the photoelectric conversion portion 202-2 provide similar functions and therefore will be described using a representative. The numeral of the circuit for the first photoelectric conversion portion 202-1 may be provided with a branch number "−1", and the numeral of the circuit for the second photoelectric conversion portion 202-2 may be provided with a branch number "−2". The branch numbers may be omitted in the description common to the two photoelectric conversion portions 202-1 and 202-2.

The circuit of each of the photoelectric conversion portions 202 has a transfer metal oxide semiconductor (MOS) transistor 203 that transfers electric charges generated in the photoelectric conversion portion 202, a reset MOS transistor 204 that resets the potential of the photoelectric conversion portion 202, and a selection MOS transistor 205 that performs pixel selection. Further, an amplification MOS transistor 201 that amplifies a charge signal is provided, and a source follower circuit is configured of the amplification MOS transistor 201 and a power supply VDD. Here, the source follower circuit (a grounded-drain circuit) is illustrated as an example of an amplification circuit using the amplification MOS transistor 201. However, the amplification circuit using the amplification MOS transistor 201 may be a grounded-source circuit, or a grounded-gate circuit. Each of the circuits has a signal line 206 for connecting the selected pixel 200 to a readout circuit 211. In the present exemplary embodiment, the first signal line 206-1 and the second signal line 206-2 are provided. A signal based on the electric charges generated in the first photoelectric conversion portion 202-1 is read out to the first signal line 206-1. A signal based on the electric charges generated in the second photoelectric conversion portion 202-2 is read out to the second signal line 206-2. The signal based on the electric charges generated in the first photoelectric conversion portion 202-1 will be hereinafter referred to as "the first signal" or "the signal corresponding to the first photoelectric conversion portion". The signal based on the electric charges generated in the second photoelectric conversion portion 202-2 will be hereinafter referred to as "the second signal" or "the signal corresponding to the second photoelectric conversion portion".

The photoelectric conversion apparatus 100 according to the present exemplary embodiment has the first readout circuit 211-1 and the second readout circuit 211-2 for each pixel column. The first signal line 206-1 is connected to an input unit (a first input unit) of the first readout circuit 211-1, and the second signal line 206-2 is connected to an input unit (a second input unit) of the second readout circuit 211-2. Each of the readout circuits 211 has an input capacitor 207 serving as the input unit, an amplifier 208, and capacitors 209 and 210, and forms an analog amplifier that amplifies a pixel signal (an analog signal) input via the signal line 206. The amplifier 208 of this example is an operational amplifier, but is not limited to the operational amplifier. Further, in this example, the input capacitor 207 is provided, but the signal line 206 may be connected to an input terminal of the amplifier 208 (in that case, the input terminal of the amplifier 208 serves as the input unit for signals).

Although not illustrated in FIG. 2, a switch is connected to the capacitor 209 and the capacitor 210. The capacitor 209 or the capacitor 210 can be alternatively selected as a feedback capacitor of the amplifier 208, by controlling the switch. An amplification factor of the readout circuit 211 (the analog amplifier) is determined by the ratio of the input capacitor 207 to the feedback capacitor 209 or 210. In a case where the respective capacitance values of the capacitors 207, 209, and 210 are expressed as C207, C209, and C210, the amplification factor is C207/C209 or C207/C210. Here, if the respective capacitance values of the capacitors 209 and 210 vary (e.g., C209>C210), two kinds of amplification factor can be set in the readout circuit 211.

A switch 212 is provided to switch between a connected state and a disconnected state between the first signal line 206-1 and the second signal line 206-2. The switch 212 is configured of a MOS transistor. When the switch 212 is turned off, the first readout circuit 211-1 reads out the first signal, and the second readout circuit 211-2 reads out the second signal. Therefore, the signal corresponding to each of the photoelectric conversion portions 202-1 and 202-2 is individually amplified to be output to the signal output circuit 106. On the other hand, when the switch 212 is turned on, the average value of the first signal and the second signal is input to both of the readout circuits 211-1 and 211-2. In other words, the switch 212 performs signal average processing for the two photoelectric conversion portions 202-1 and 202-2. The switch 212 may be hereinafter referred to as the MOS transistor 212 for signal average processing.

(Pixel Readout)

Figure 3:
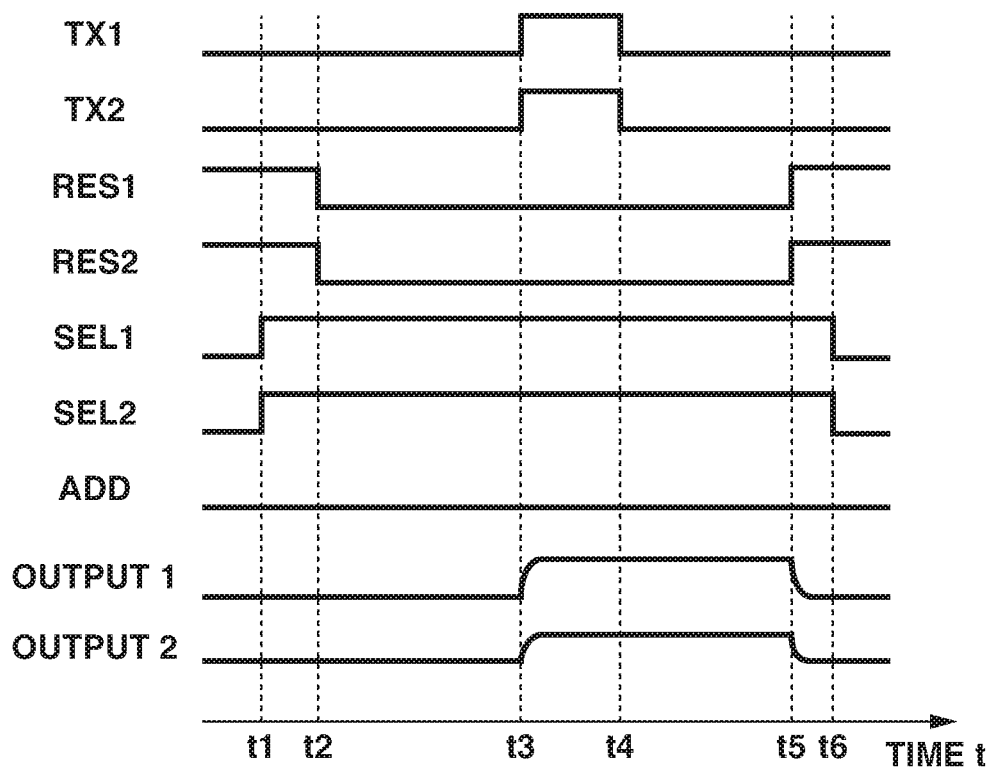
FIG. 3 is a diagram illustrating an autofocus (AF) readout mode, according to the first exemplary embodiment.
Figure 4:
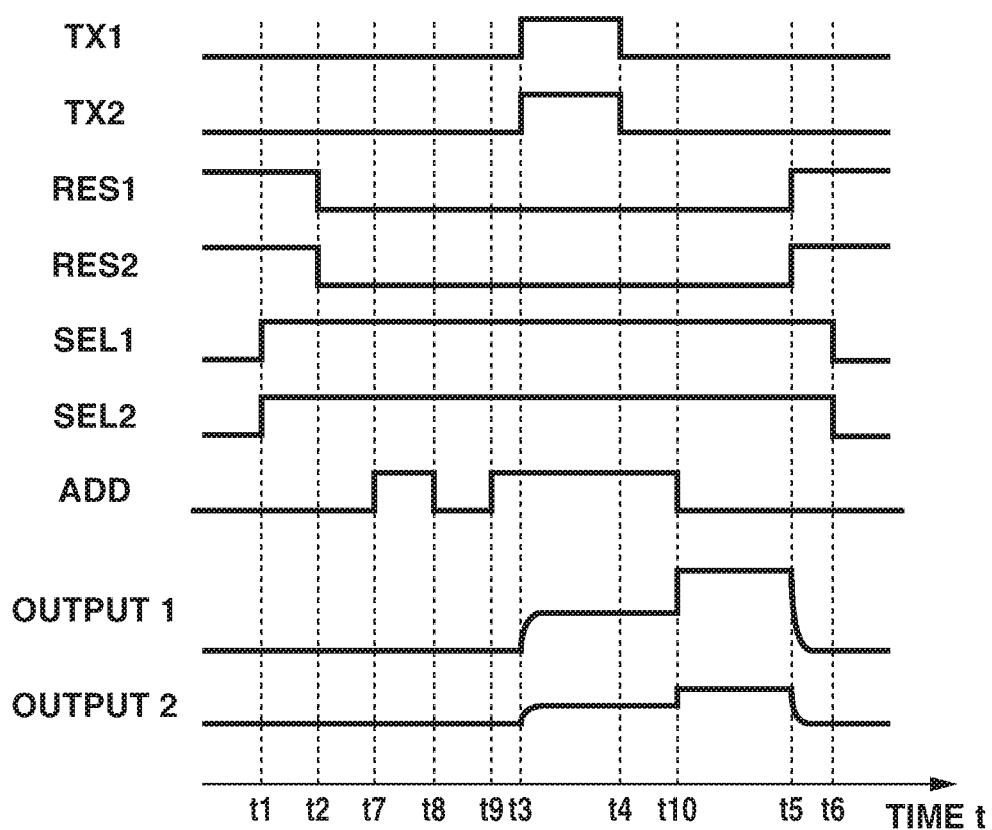
FIG. 4 is a diagram illustrating an imaging readout mode, according to the first exemplary embodiment.

FIG. 3 and FIG. 4 illustrate details of driving timing for pixel readout, according to the first exemplary embodiment. TX1 is a control signal for driving the transfer MOS transistor 203-1, and TX2 is a control signal for driving the transfer MOS transistor 203-2. RES1 is a control signal for driving the reset MOS transistor 204-1, and RES2 is a control signal for driving the reset MOS transistor 204-2. SEL1 is a control signal for driving the selection MOS transistor 205-1, and SEL2 is a control signal for driving the selection MOS transistor 205-2. ADD is a control signal for driving the MOS transistor 212 for signal average processing. These control signals (voltages) are provided from the vertical scanning circuit 103 or the horizontal scanning circuit 105. An output 1 is a signal output from the first readout circuit (the analog amplifier) 211-1, and an output 2 is a signal output from the second readout circuit (the analog amplifier) 211-2.

(1) AF Readout Mode

A readout method for acquiring phase difference information from an object (hereinafter referred to as "AF readout mode" or "AF readout") will be described with reference to FIG. 3. In the AF readout, an amplification gain of the first readout circuit 211-1 and an amplification gain of the second readout circuit 211-2 are set to be the same value. At a time t1, SEL1 and SEL2 transition to HIGH, thereby bringing a pixel of the relevant row into a selected state. At a time t2, RES1 and RES2 transition to LOW, thereby terminating pixel reset. Afterward, sampling of a noise level is performed until a time t3. At the time t3, TX1 and TX2 transition to HIGH, thereby starting charge transfer from the photoelectric conversion portion. At a time t4, TX1 and TX2 transition to LOW, thereby terminating the charge transfer. Afterward, sampling of a signal level is performed until a time t5. At the time t5, RES1 and RES2 transition to HIGH, thereby performing pixel reset. Subsequently, at a time t6, SEL1 and SEL2 transition to LOW, thereby cancelling the selection of the pixel. From the time t1 to the time t6, ADD remains in LOW, and the signal corresponding to each of the photoelectric conversion portions 202-1 and 202-2 is individually amplified to be input independently to the signal output circuit 106. The phase difference information of the object can be acquired by performing the AF readout in the two photoelectric conversion portions 202-1 and 202-2 simultaneously. In a case where the two photoelectric conversion portions 202-1 and 202-2 are laterally disposed within the pixel, the phase difference information for a horizontal direction can be acquired. In a case where the two photoelectric conversion portions 202-1 and 202-2 are vertically disposed within the pixel, the phase difference information for a vertical direction can be acquired.

(2) Imaging Readout Mode

A readout method for extracting imaging information from an object (hereinafter referred to as "imaging readout mode" or "imaging readout") will be described with reference to FIG. 4. In the imaging readout, an amplification gain G1 of the first readout circuit 211-1 and an amplification gain G2 of the second readout circuit 211-2 are set to be different from each other (e.g., G1>G2).

At the time t1, SEL1 and SEL2 transition to HIGH, thereby bringing a pixel of the relevant row into a selected state. At the time t2, RES1 and RES2 transition to LOW, thereby terminating pixel reset. At a time t7, ADD transitions to HIGH, thereby averaging output signals of the two photoelectric conversion portions 202-1 and 202-2. At a time t8, ADD transitions to LOW, thereby terminating the averaging. Afterward, sampling of a noise level is performed until a time t9. At the time t9, ADD transitions to HIGH. At the time t3, TX1 and TX2 transition to HIGH, thereby starting charge transfer from the photoelectric conversion portion. At the time t4, TX1 and TX2 transition to LOW, thereby terminating the charge transfer. At a time t10, ADD transitions to LOW, thereby bringing the input capacitor of each of the readout circuits 211 into a C207-alone state. Afterward, sampling of a signal level is performed until the time t5. The imaging information of the pixel 200 can be thereby read out from the amplifiers 208-1 and 208-2. At this time, C207/C210 is set as the amplification factor of the first readout circuit 211-1, and C207/C209 is set as the amplification factor of the second readout circuit 211-2. Outputs with two different gains can be thereby extracted simultaneously, with respect to the signal output of the same pixel 200. The dynamic range of the photoelectric conversion apparatus 100 can be enhanced by processing these signal outputs with the two gains in combination.

Switching between the AF readout mode and the imaging readout mode described above may be performed frame by frame, or may be performed row by row. The switching frame by frame is a method that can select frame by frame the readout mode to be used, when images of a plurality of frames are sequentially captured (e.g., in moving image capturing). The mode may be changed for every frame, or may be changed for every plurality of frames. In a case where the switching frame by frame is used, signal readout is performed in the same mode, for all rows within one frame. The switching row by row is a method that can select row by row the readout mode to be used, when an image of one frame is captured. The mode may be changed for every row, or may be changed for every plurality of rows. The AF readout and the imaging readout of the present exemplary embodiment can all be performed with the same timing except for the timing at which ADD is driven. There is no difference between the AF readout and the imaging readout, in terms of the time required for a series of readout operations. Therefore, the processing time for each frame is constant, even if switching between the AF readout and the imaging readout is performed frame by frame during the moving image capturing. Further, the processing time remains unchanged, even if switching between the AF readout and the imaging readout row by row, such as performing the AF readout for one row and performing the imaging readout for another row in one frame, is performed. For this reason, no change occurs in frame rate of the moving image and no variation occurs in accumulation time of the photoelectric conversion apparatus, even if switching between the AF readout and the imaging readout is performed. Therefore, a captured moving image of high quality can be acquired.

(Photoelectric Conversion Apparatus)

Figure 5:
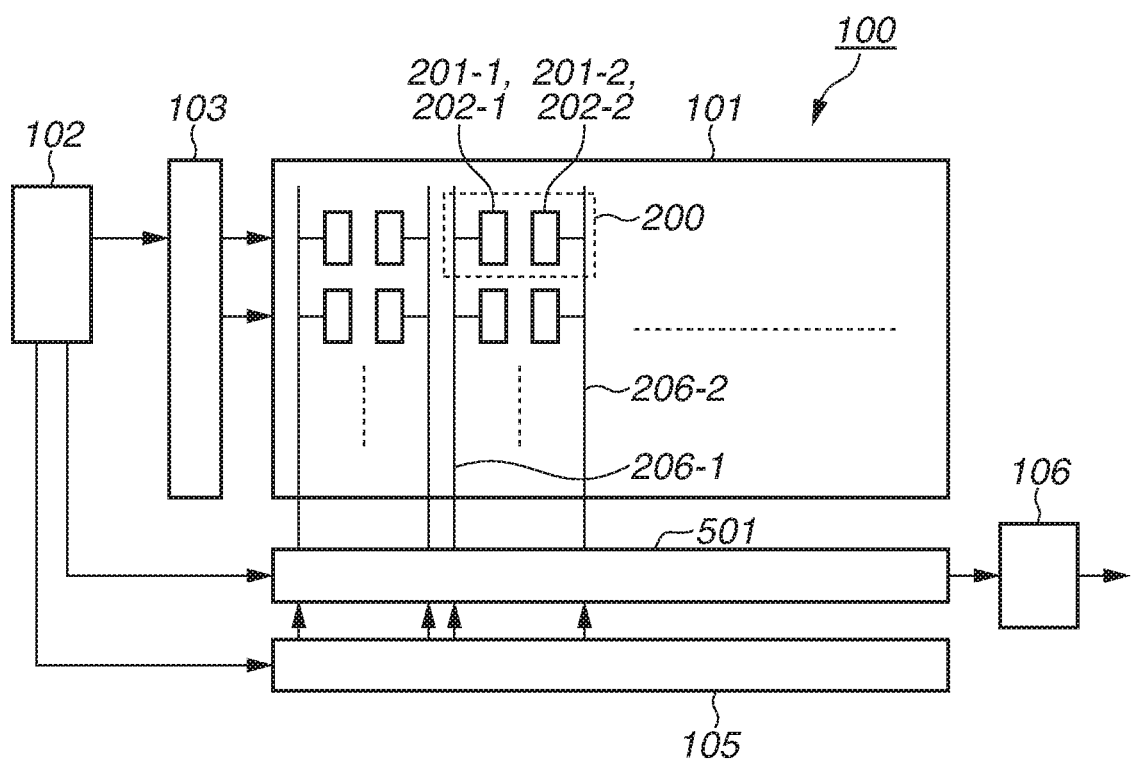
FIG. 5 is a block diagram illustrating a configuration of a photoelectric conversion apparatus according to a second exemplary embodiment.

FIG. 5 is a block diagram illustrating a configuration of a photoelectric conversion apparatus according to a second exemplary embodiment. Signals photoelectrically converted in a pixel area 101 are sequentially read out for each row by a vertical scanning circuit 103 controlled by a timing generator 102. The read-out signals are input to an AD converter 501 in which the signals are subjected to AD conversion processing. Digital signals obtained thereby are sequentially input to a signal output circuit 106, by a horizontal scanning circuit 105 controlled by the timing generator 102. The digital signals are then subjected to processing such as noise subtraction processing in the signal output circuit 106, and then output to outside (e.g., an image processing circuit) as an output of a photoelectric conversion apparatus 100.

(Pixel and Readout Circuit)

Figure 6:
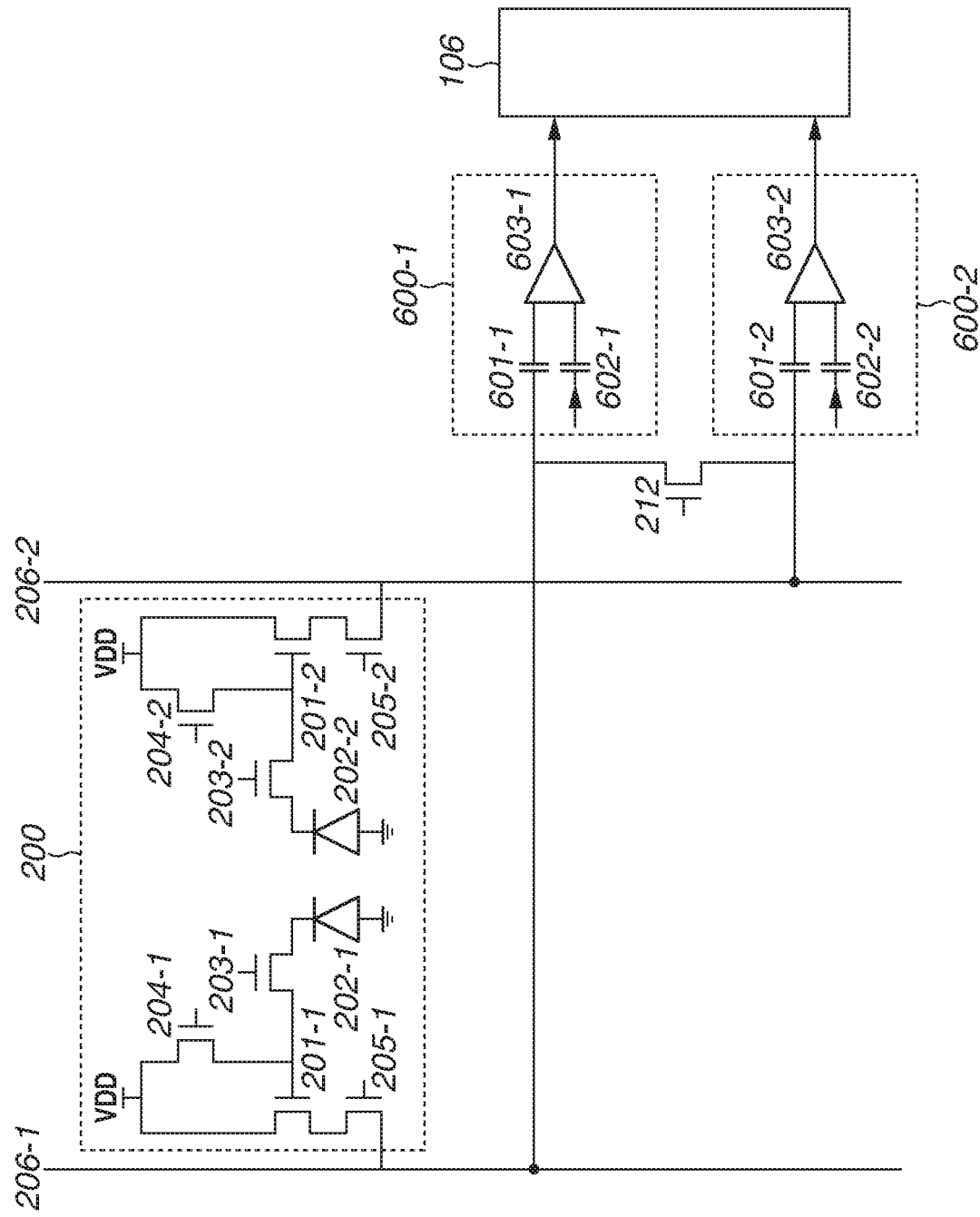
FIG. 6 is an equivalent circuit diagram illustrating a configuration of a pixel and a readout circuit, according to the second exemplary embodiment.

FIG. 6 illustrates a configuration of a pixel and a readout circuit, according to the second exemplary embodiment. Each of pixels 200 in the pixel area 101 is configured of two photoelectric conversion portions 202, as with the first exemplary embodiment. A method for reading out first and second signals from the pixel 200 is similar to that in the first exemplary embodiment.

The photoelectric conversion apparatus 100 according to the present exemplary embodiment has a first readout circuit 600-1 and a second readout circuit 600-2 for each pixel column. Each of the readout circuits 600 has a sample-and-hold capacitor 601 serving as an input unit, a reference capacitor 602, and a comparator 603, and forms an AD converter that converts a pixel signal (an analog signal) input via a signal line 206 into a digital value.

A pixel signal is input to the sample-and-hold capacitor 601 in which the signal is subjected to sampling and holding by a switch that is not illustrated. A reference signal (a ramp signal) of a temporally changing voltage is input to the reference capacitor 602. The comparator 603 converts an analog signal into a digital value, by comparing the voltage of the pixel signal and the voltage of the reference signal, and recording a time at which the two voltages become equal. The gain of the AD conversion can be changed by changing a temporal variance of the reference signal (the gradient of the ramp signal) in the AD conversion. In other words, the slower the temporal variance of the reference signal is (the smaller the gradient of the ramp signal is), the larger the digital value with respect to the same analog signal is. Therefore, this is equivalent to an increase in the gain of the AD conversion.

A switch (a MOS transistor for signal average processing) 212 that switches between connection and disconnection corresponding to a connected state and a disconnected state, respectively, between the first signal line 206-1 and the second signal line 206-2 is also provided in the present exemplary embodiment. When the switch 212 is turned off, the first signal line 206-1 and the second signal line 206-2 are disconnected. When the switch 212 is turned on, the first signal line 206-1 and the second signal line 206-2 are connected. When the switch 212 is turned off, the first readout circuit 600-1 reads out a first signal, and the second readout circuit 600-2 reads out a second signal. Therefore, the signal corresponding to each of the photoelectric conversion portions 202-1 and 202-2 is individually subjected to the AD conversion to be output to the signal output circuit 106. On the other hand, when the switch 212 is turned on, the average value of the first signal and the second signal is input to both of the readout circuits 600-1 and 600-2.

(Pixel Readout)

Figure 7:
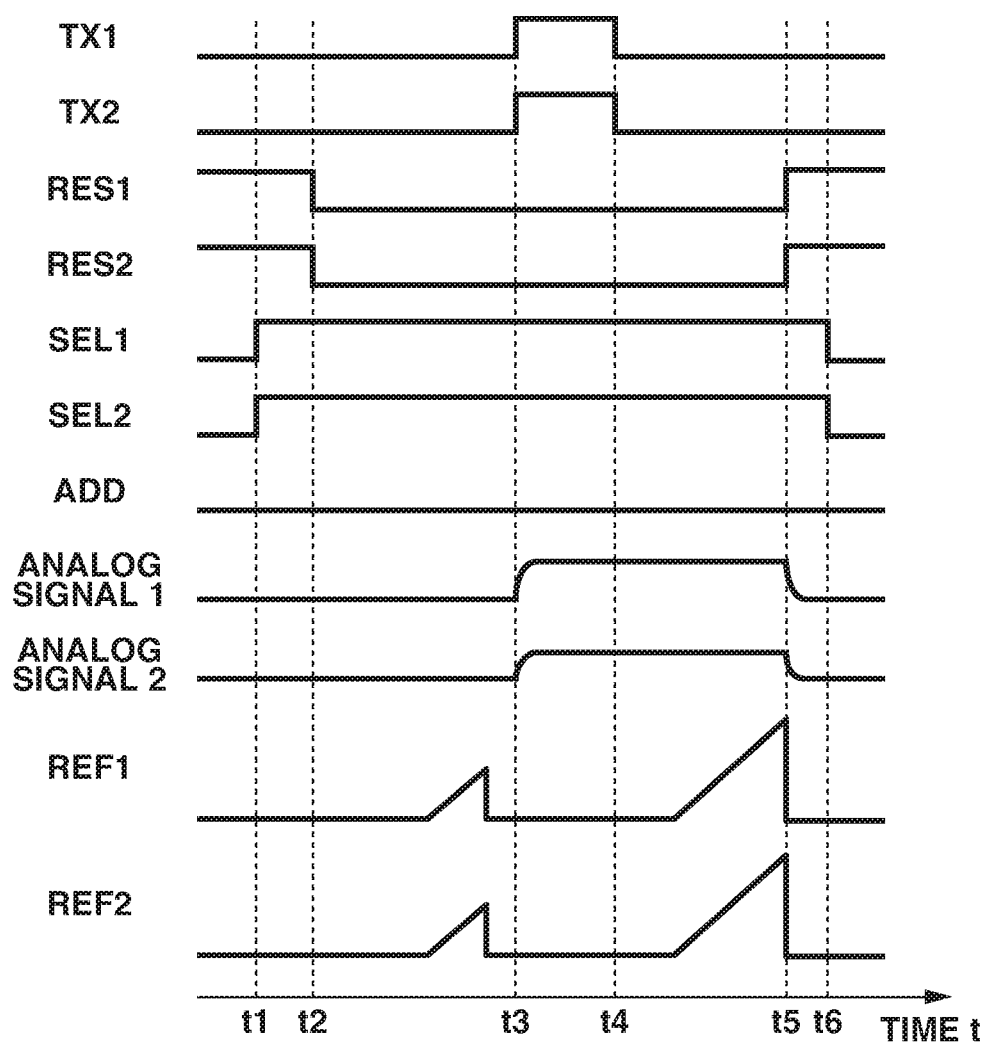
FIG. 7 is a diagram illustrating an AF readout mode, according to the second exemplary embodiment.
Figure 8:
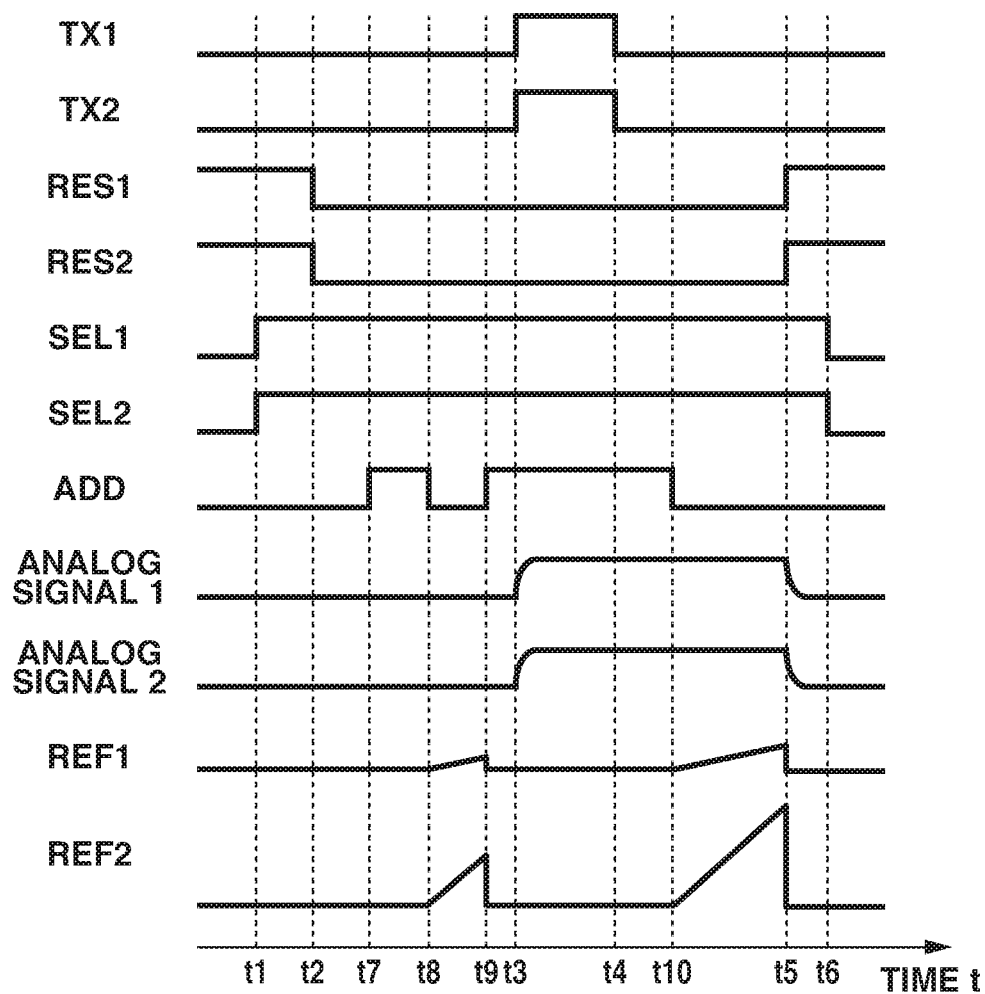
FIG. 8 is a diagram illustrating an imaging readout mode, according to the second exemplary embodiment.

FIG. 7 and FIG. 8 illustrate details of driving timing for pixel readout, according to the second exemplary embodiment. As with FIG. 3 and FIG. 4, FIG. 7 and FIG. 8 illustrate a control signal (a voltage) to be applied to each of the MOS transistors. An analog signal 1 indicates a voltage to be input to a sample-and-hold capacitor 601-1, and an analog signal 2 indicates a voltage to be input to a sample-and-hold capacitor 601-2. REF1 indicates a voltage of a reference signal (a ramp signal) to be input to a capacitor 602-1, and REF2 indicates a voltage of a reference signal (a ramp signal) to be input to a capacitor 602-2.

(1) AF Readout Mode

AF readout will be described with reference to FIG. 7. At the time t1, SEL1 and SEL2 transition to HIGH, thereby bringing a pixel of the relevant row into a selected state. At the time t2, RES1 and RES2 transition to LOW, thereby terminating pixel reset. Afterward, the A/D conversion for a noise signal is performed until the time t3. At the time t3, TX1 and TX2 transition to HIGH, thereby starting charge transfer from the photoelectric conversion portion. At the time t4, TX1 and TX2 transition to LOW, thereby terminating the charge transfer. Afterward, a reference signal is input as each of REF1 and REF2, and the A/D conversion for the signal is performed until the time t5. At the time t5, RES1 and RES2 transition to HIGH, thereby performing the pixel reset. Subsequently, at the time t6, SEL1 and SEL2 transition to LOW, thereby cancelling the selection of the pixel. From the time t1 to the time t6, ADD remains in LOW, and the signal corresponding to each of the photoelectric conversion portions 202-1 and 202-2 is independently subjected to the A/D conversion. According to the AF readout, phase difference information of an object can be acquired as with the first exemplary embodiment.

(2) Imaging Readout Mode

Imaging readout will be described with reference to FIG. 8. In the imaging readout, the gradient of the reference signal REF1 to be input to the first readout circuit 600-1 and the gradient of the reference signal REF2 to be input to the second readout circuit 600-2 are different from each other. In the example in FIG. 8, a reference signal with a small gradient (a slow temporal variance of a voltage) is input as REF1, and a reference signal with a large gradient (a fast temporal variance of a voltage) is input as REF2. The gain of the AD conversion of the first readout circuit 600-1 and the gain of the AD conversion of the second readout circuit 600-2 thereby are different from each other.

At the time t1, SEL1 and SEL2 transition to HIGH, thereby bringing a pixel of the relevant row into a selected state. At the time t2, RES1 and RES2 transition to LOW, thereby terminating pixel reset. At the time t7, ADD transitions to HIGH, thereby averaging signals of the two photoelectric conversion portions 202-1 and 202-2. At the time t8, ADD transitions to LOW, thereby terminating the averaging. Afterward, A/D conversion of a noise signal is performed until the time t9. At the time t9, ADD transitions to HIGH. At the time t3, TX1 and TX2 transition to HIGH, thereby starting charge transfer from the photoelectric conversion portion. At the time t4, TX1 and TX2 transition to LOW, thereby terminating the charge transfer. At the time t10, ADD transitions to LOW, and the AD conversion of the analog signals 1 and 2 is performed until the time t5. Here, as indicated by REF1 and REF2 in FIG. 8, digital outputs with two different gains can be simultaneously extracted with respect to the signal output of the same pixel 200, by differentiating the reference signals to be used for the AD conversion. The dynamic range of the photoelectric conversion apparatus 100 can be enhanced by processing these digital outputs with the two gains in combination.

In the above-described configuration of the second exemplary embodiment as well, the photoelectric conversion apparatus that can acquire a captured image of high quality can be provided, as with the first exemplary embodiment.

Figure 9:
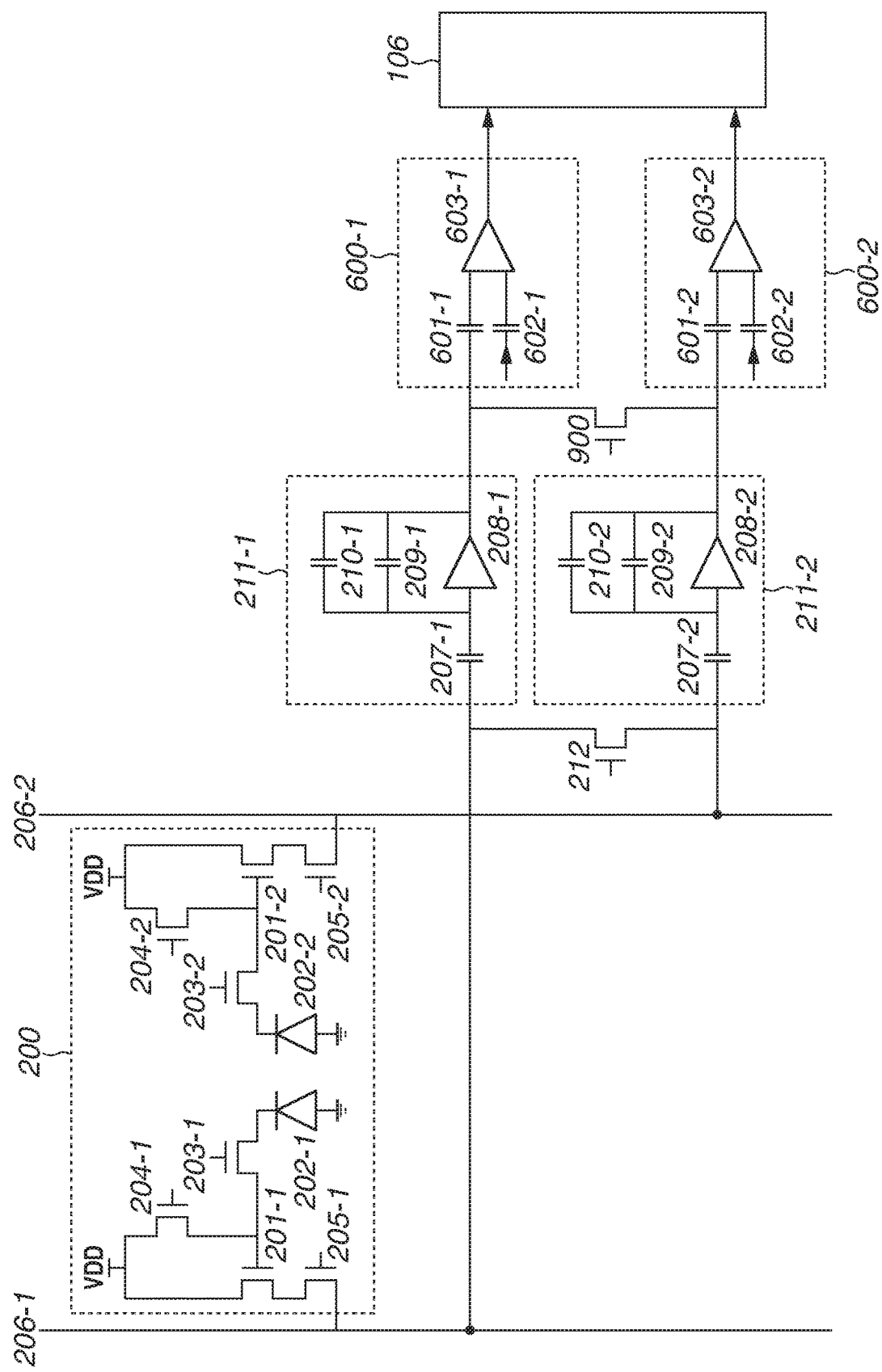
FIG. 9 is a block diagram illustrating a configuration of a photoelectric conversion apparatus according to a third exemplary embodiment.

FIG. 9 is a block diagram illustrating a configuration of a photoelectric conversion apparatus according to a third exemplary embodiment. The present exemplary embodiment is a combination of the first exemplary embodiment and the second exemplary embodiment. The photoelectric conversion apparatus according to the present exemplary embodiment includes a circuit that has an analog amplifier and an AD converter as a readout circuit. Specifically, in the readout circuit of the present exemplary embodiment, at first, a signal read out from a pixel 200 is amplified by an analog amplifier (211-1, 211-2), and the amplified signal is converted into a digital value by an AD converter (600-1, 600-2) in the subsequent stage. Specific configuration and operation of each of the circuits are similar to those described in each of the first and second exemplary embodiments and therefore will not be described. In FIG. 9, a switch (a MOS transistor for signal average processing) 900 is provided between the analog amplifiers (211-1 and 211-2) and the AD converters (600-1 and 600-2). However, the switch 900 may be omitted, if processing for averaging signals output from the two analog amplifiers is not necessary.

In the configuration of the present exemplary embodiment as well, AF readout and imaging readout similar to those of each of the first exemplary embodiment and the second exemplary embodiment can be performed. Here, the gain of the readout circuit in the imaging readout can be set with either one of an amplification gain of the analog amplifier and an AD conversion gain of the AD converter, or can be set with both of the amplification gain and the AD conversion gain. Using both of the amplification gain and the AD conversion gain can make a gain difference greater than that in a case where only the analog amplifier is used, and can reduce the time required for the conversion to be shorter than that in a case where a gain difference is made with only the AD converter.

A fourth exemplary embodiment will be described. In the above-described first to third exemplary embodiments, the AF readout mode in which the two readout circuits individually process the two signals corresponding to the two photoelectric conversion portions, and the imaging readout mode in which the two readout circuits process the average signal of the two signals have been described. In contrast, in the fourth exemplary embodiment, a third readout mode in which two readout circuits process one signal corresponding to one photoelectric conversion portion will be described. For a circuit arrangement of the photoelectric conversion apparatus, a circuit arrangement similar to that in each of the above-described exemplary embodiments can be adopted, and therefore no description thereof will be provided.

Figure 10:
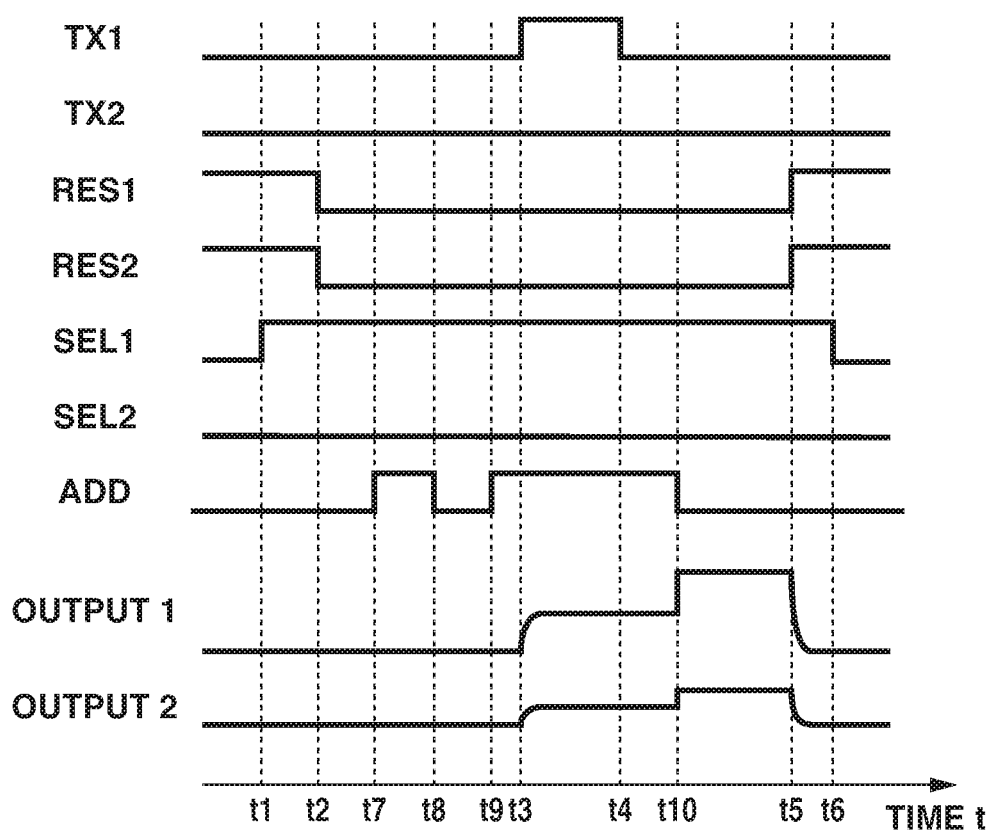
FIG. 10 is a diagram illustrating a readout mode, according to a fourth exemplary embodiment.
Figure 11:
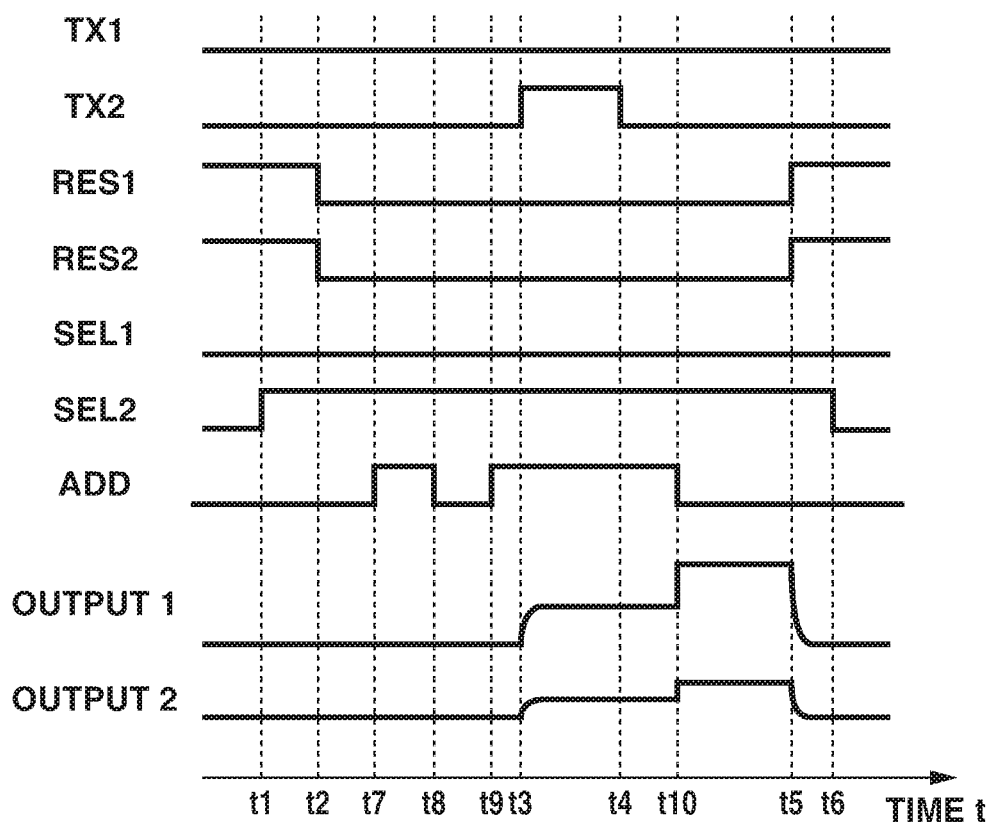
FIG. 11 is a diagram illustrating a readout mode, according to the fourth exemplary embodiment.

FIG. 10 and FIG. 11 illustrate driving timing for pixel readout, according to the fourth exemplary embodiment. FIG. 10 is an example of processing for reading out a signal of a first photoelectric conversion portion 202-1. FIG. 11 is an example of processing for reading out a signal of a second photoelectric conversion portion 202-2. In these examples, an amplification gain G1 of a first readout circuit 211-1 and an amplification gain G2 of a second readout circuit 211-2 are set to be different from each other (G1>G2).

In a case where a signal corresponding to the first photoelectric conversion portion 202-1 is to be read, SEL1 transitions to HIGH at the time t1 as illustrated in FIG. 10, thereby bringing the first photoelectric conversion portion 202-1 of a pixel of the relevant row into a selected state. At this moment, SEL2 remains in LOW, and selection of the second photoelectric conversion portion 202-2 is not performed. At the time t2, RES1 and RES2 transition to LOW, thereby terminating pixel reset. At the time t7, ADD transitions to HIGH. At the time t8, ADD transitions to LOW. Subsequently, sampling of a noise level is performed until the time t9. At the time t9, ADD transitions to HIGH. At the time t3, TX1 transitions to HIGH, thereby starting charge transfer from the first photoelectric conversion portion 202-1. At this moment, TX2 remains in LOW. At the time t4, TX1 transitions to LOW, thereby terminating the charge transfer. At the time t10, ADD transitions to LOW. Afterward, sampling of a signal level of the first photoelectric conversion portion 202-1 is performed until the time t5. Imaging information of the first photoelectric conversion portion 202-1 can be thereby read out from amplifiers 208-1 and 208-2. At this time, C207/C210 is set as the amplification factor of the first readout circuit 211-1, and C207/C209 is set as the amplification factor of the second readout circuit 211-2. Signals based on electric charges generated in the first photoelectric conversion portion 202-1 can be simultaneously read out with two different gains. The dynamic range of the signal corresponding to the first photoelectric conversion portion 202-1 can be expanded, by combining these signals obtained with the two different gains.

Following the processing in FIG. 10, the processing for reading out the signal of the second signal photoelectric conversion portion 202-2 (FIG. 11) is executed. The processing is different from the processing in FIG. 10 as follows. First, in place of SEL1, SEL2 transitions to HIGH, thereby bringing the second photoelectric conversion portion 202-2 into a selected state. Second, TX2 transitions to HIGH in charge transfer. Other steps of the processing are similar to those of the processing in FIG. 10 and therefore will not be described. According to the processing in FIG. 11, signals based on electric charges generated in the second photoelectric conversion portion 202-2 can be simultaneously read out with two different gains. The dynamic range of the signal corresponding to the second photoelectric conversion portion 202-2 can be expanded, by combining these signals obtained with the two different gains.

According to the configuration of the present exemplary embodiment described above, a signal of a high dynamic range can be read out from each of the photoelectric conversion portions. Further, phase difference information of an object can be accurately acquired, by using the signal corresponding to the first photoelectric conversion portion and the signal corresponding to the second photoelectric conversion portion that are sequentially read out as described above. Therefore, ranging and autofocus for the object can be performed with high accuracy.

Figure 12:
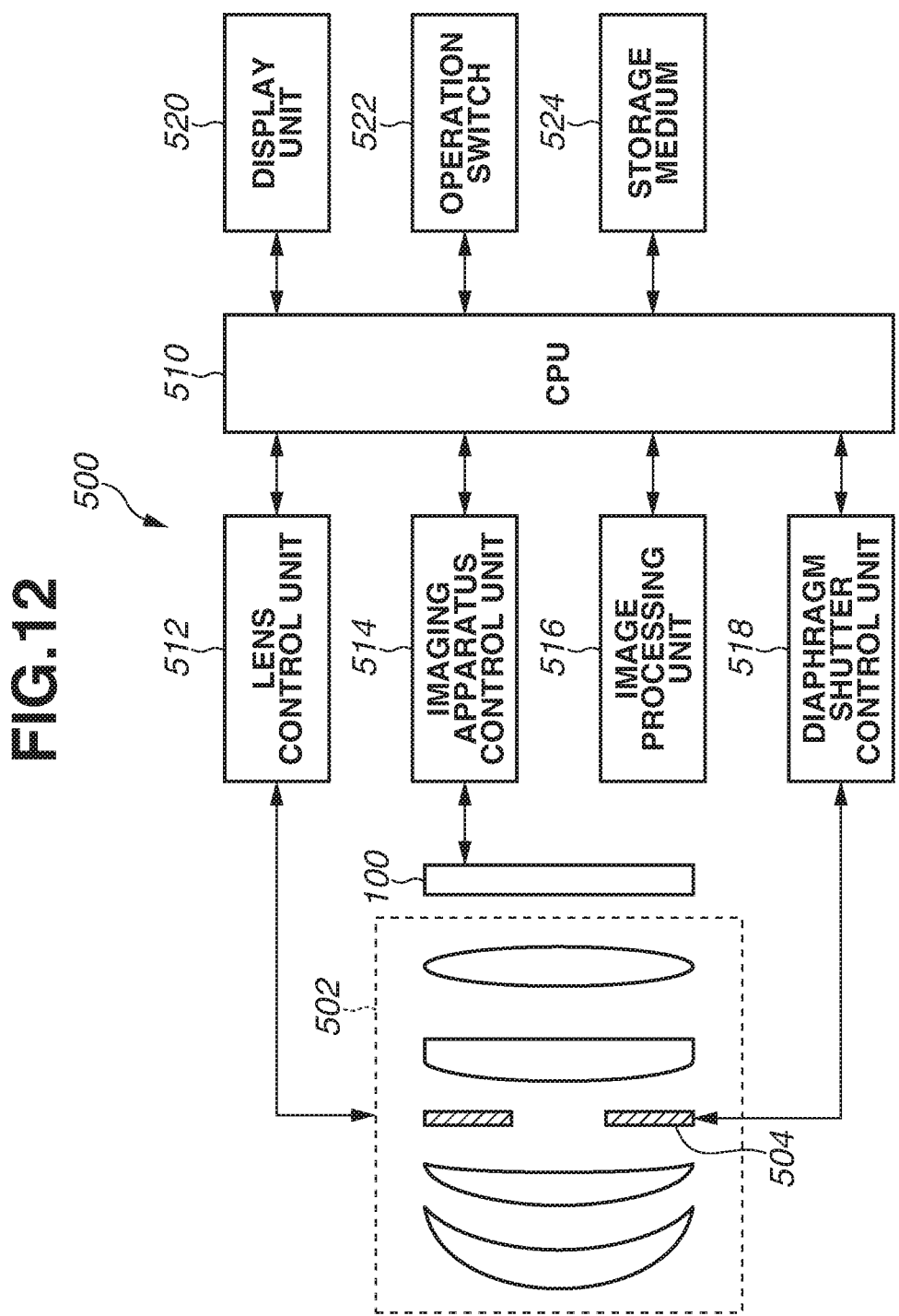
FIG. 12 is a diagram illustrating a configuration of an imaging system according to a fifth exemplary embodiment.

An imaging system according to a fifth exemplary embodiment will be described with reference to FIG. 12. FIG. 12 is a block diagram illustrating a schematic configuration of the imaging system according to the present exemplary embodiment.

The photoelectric conversion apparatus described above in each of the first to fourth exemplary embodiments is applicable to various imaging systems. The imaging system to which the photoelectric conversion apparatus is applicable is not limited in particular. Examples of such an imaging system include various apparatuses such as a digital still camera, a digital camcorder, a surveillance camera, a copier, a facsimile, a mobile phone, an on-vehicle camera, an observation satellite, and a medical camera. A camera module including an optical system such as a lens and a photoelectric conversion apparatus is also included in the examples of the imaging system. FIG. 12 illustrates a block diagram of a digital still camera provided as an example of these apparatuses.

As illustrated in FIG. 12, an imaging system 500 includes a photoelectric conversion apparatus 100, an imaging optical system 502, a central processing unit (CPU) 510, a lens control unit 512, an imaging apparatus control unit 514, an image processing unit 516, a diaphragm shutter control unit 518, a display unit 520, an operation switch 522, and a storage medium 524.

The imaging optical system 502 is an optical system for forming an optical image of an object, and includes a lens group and a diaphragm 504. The diaphragm 504 has a function of adjusting a light quantity in image capturing, by adjusting an aperture diameter. The diaphragm 504 also has a function as an exposure-time adjustment shutter in still-image capturing. The lens group and the diaphragm 504 are held to be capable of proceeding and retreating along an optical axis direction. Interlocking operation of these components implements a magnification varying function (a zoom function) and a focal-point adjustment function. The imaging optical system 502 may be integral with the imaging system, or may be an imaging lens that can be attached to the imaging system.

The photoelectric conversion apparatus 100 is disposed to have an imaging plane located in an image space of the imaging optical system 502. The photoelectric conversion apparatus 100 is the photoelectric conversion apparatus described in each of the first to fourth exemplary embodiments, and includes a CMOS sensor (a pixel area) and peripheral circuits (a peripheral circuit area). In the photoelectric conversion apparatus 100, pixels each having a plurality of photoelectric conversion portions are two-dimensionally arranged, and a color filter is disposed for these pixels. A two-dimensional single-board color sensor is thereby formed. The photoelectric conversion apparatus 100 photoelectrically converts an object image formed by the imaging optical system 502, and outputs the resultant as an image signal or a focus detection signal.

The lens control unit 512 enables a variable power operation and a focal point adjustment, by controlling the driving for proceeding/retraction of the lens group of the imaging optical system 502. The lens control unit 512 is configured of a circuit or a processor configured to implement such a function. The diaphragm shutter control unit 518 adjusts an image-capturing light quantity by changing the aperture diameter of the diaphragm 504 (as a variable aperture value). The diaphragm shutter control unit 518 is configured of a circuit or a processor configured to implement such a function.

The CPU 510 is a controller provided inside a camera and performing various kinds of control of a camera body. The CPU 510 includes an arithmetic unit, a read only memory (ROM), a random access memory (RAM), an A/D converter, a digital-to-analog (D/A) converter, and a communication interface circuit. The CPU 510 controls the operation of each unit in the camera based on a computer program stored in the ROM, thereby executing a series of image-capturing operation steps, including AF, imaging, image processing, and recording. The AF includes detection of a focus state (focus detection) of the imaging optical system 502. The CPU 510 also serves as a signal processing unit.

The imaging apparatus control unit 514 is provided to control the operation of the photoelectric conversion apparatus 100, and to perform AD conversion of a signal output from the photoelectric conversion apparatus 100 to transmit the resultant to the CPU 510. The imaging apparatus control unit 514 is configured of a circuit or a processor configured to implement those functions. The photoelectric conversion apparatus 100 may have such an A/D conversion function. The image processing unit 516 generates an image signal by performing image processing such as γ-conversion and color interpolation on a signal subjected to the AD conversion. The image processing unit 516 is configured of a circuit or a processor configured to implement such a function. The display unit 520 is a display apparatus such as a liquid crystal display (LCD), and displays information about an image-capturing mode of the camera, a preview image before image capturing, an image for confirmation after image capturing, and a focusing state in focus detection. The operation switch 522 is configured of switches including a power switch, a release (an image-capturing trigger) switch, a zoom operation switch, and an image-capturing mode selection switch. The storage medium 524 records an image such as a captured image. The storage medium 524 may be built in the imaging system, or may be a removable medium such as a memory card.

In this way, the imaging system 500 to which the photoelectric conversion apparatus 100 according to each of the first to fourth exemplary embodiments is applied is configured, and thereby a high-performance imaging system can be implemented.

Figure 13A:
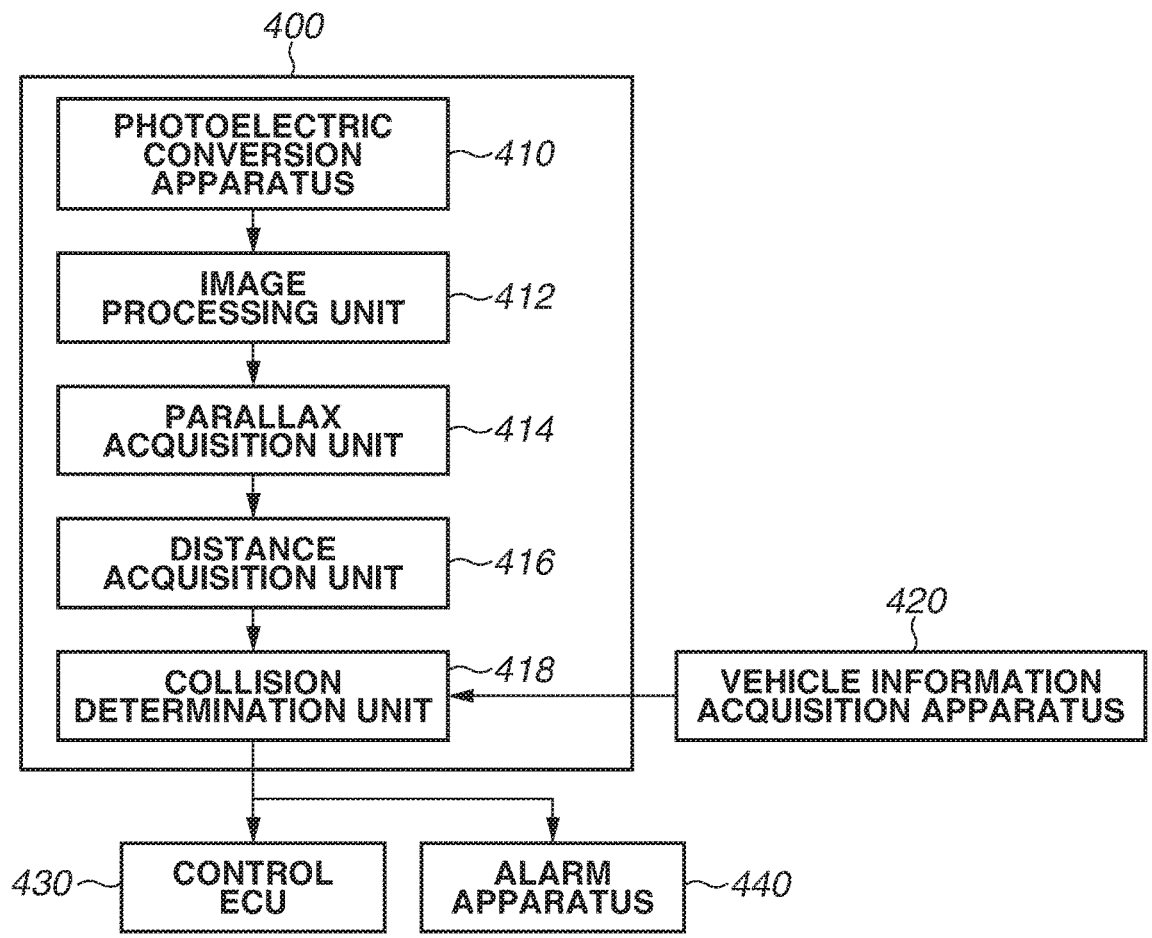
FIGS. 13A and 13B illustrate a configuration of an imaging system and a configuration of a moving body, respectively, according to a sixth exemplary embodiment.
Figure 13B:
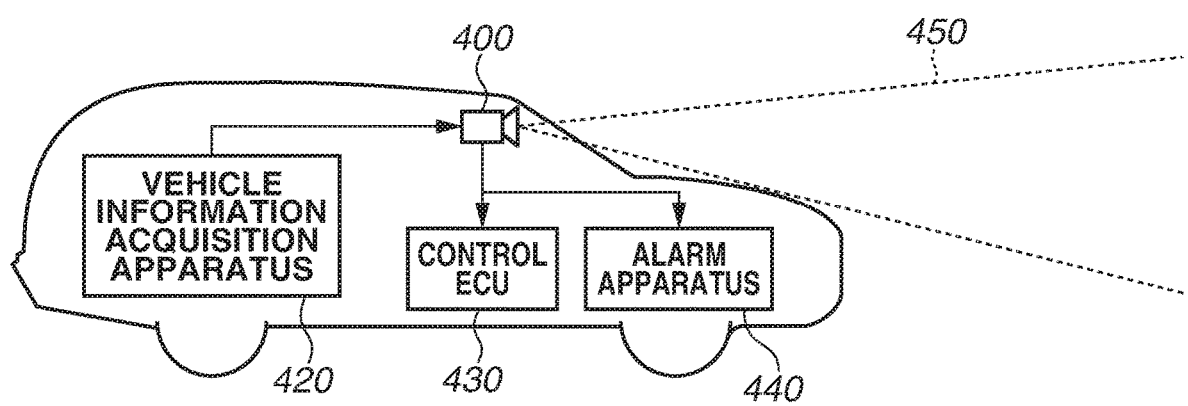

An imaging system and a moving body according to a sixth exemplary embodiment will be described with reference to FIGS. 13A and 13B. FIGS. 13A and 13B illustrate a configuration of the imaging system and a configuration of the moving body, respectively, according to the present exemplary embodiment.

FIG. 13A illustrates an example of an imaging system 400 related to an on-vehicle camera. The imaging system 400 has a photoelectric conversion apparatus 410. The photoelectric conversion apparatus 410 is the photoelectric conversion apparatus according to any one of the first to fourth exemplary embodiments described above. The imaging system 400 has an image processing unit 412 and a parallax acquisition unit 414. The image processing unit 412 is a processor that performs image processing, on a plurality of pieces of image data acquired by the photoelectric conversion apparatus 410. The parallax acquisition unit 414 is a processor that calculates a parallax (a phase difference of a parallax image), based on the plurality of pieces of image data acquired by the photoelectric conversion apparatus 410. The imaging system 400 further has a distance acquisition unit 416 and a collision determination unit 418. The distance acquisition unit 416 is a processor that calculates a distance to a target object, based on the calculated parallax. The collision determination unit 418 is a processor that determines whether there is a possibility of collision, based on the calculated distance. Here, the parallax acquisition unit 414 and the distance acquisition unit 416 are each an example of an information acquisition unit that acquires information such as distance information indicating a distance to a target object. In other words, the distance information is information about a parallax, a de-focusing quantity, and a distance to a target object. The collision determination unit 418 may determine a possibility of collision, by using any one of these pieces of distance information. The above-described processors may each be implemented by hardware designed for a special purpose, or may be implemented by general-purpose hardware that performs an arithmetic operation based on a software module. Further, the processors each may be implemented by a field programmable gate array (FPGA) or an application specific integrated circuit (ASIC), or may be implemented by a combination of these devices.

The imaging system 400 is connected to a vehicle information acquisition apparatus 420, and can acquire vehicle information such as a vehicle speed, a yaw rate, and a rudder angle. Further, a control electronic control unit (ECU) 430 is connected to the imaging system 400. The control ECU 430 is a control apparatus that outputs a control signal for generating a braking force for a vehicle, based on a result of determination by the collision determination unit 418. In other words, the control ECU 430 is an example of a moving body control unit that controls a moving body based on distance information. The imaging system 400 is also connected to an alarm apparatus 440 that provides a warning to a driver, based on a result of determination by the collision determination unit 418. For example, in a case where a result of determination by the collision determination unit 418 indicates a high possibility of collision, the control ECU 430 performs vehicle control for avoiding collision or reducing damage, by braking, releasing an accelerator, or suppressing an engine output. The alarm apparatus 440 gives a warning to a user by generating an audible alarm, displaying alarm information on a screen of a car navigation system, or vibrating a seatbelt or steering.

In the present exemplary embodiment, the imaging system 400 captures an image of an area around the vehicle, e.g., an image of the front or the rear. FIG. 13B illustrates the imaging system 400 in a case where an image of the front (an imaging area 450) of the vehicle is captured. The vehicle information acquisition apparatus 420 sends an instruction for operating the imaging system 400 to perform imaging. The imaging system 400 of the present exemplary embodiment can further enhance the accuracy of ranging, by using the photoelectric conversion apparatus according to any one of the first to fourth exemplary embodiments described above, as the photoelectric conversion apparatus 410.

The example of performing control for not colliding with another vehicle has been described above, but the imaging system is also applicable to control such as automatic driving control for following another vehicle and automatic driving control for not deviating from a lane. Further, the imaging system is applicable to not only a vehicle such as an automobile, but also, for example, a moving body (a transport machine) such as a ship, a plane, or an industrial robot. A movement apparatus in the moving body (the transport machine) is any of various drive sources such as an engine, a motor, a wheel, and a propeller. In addition, the imaging system is applicable to not only the moving body, but also an apparatus that utilizes object recognition in a wide range, such as an intelligent transport system (ITS).

Each of the exemplary embodiments described above is only a specific example of the embodiments, and the scope of the disclosure is not limited to the configurations of the above-described exemplary embodiments. For example, in the exemplary embodiments described above, the configuration in which one pixel has the two photoelectric conversion portions and the two readout circuits are provided for each pixel column has been described as an example. However, the number of the photoelectric conversion portions and the number of the readout circuits are not limited to this example. The photoelectric conversion portion 202-1 and the photoelectric conversion portion 202-2 for readout to the separate signal lines 206-1 and 206-2 may belong to different pixels. The number of the photoelectric conversion portions provided in one pixel may be one. Alternatively, three or more photoelectric conversion portions may be provided in one pixel, or three or more readout circuits may be provided for each pixel column. In such a configuration as well, a switch may be provided between the signal line and the readout circuit of the pixel column. This enables switching between a mode of individually processing an output signal of each of the photoelectric conversion portions and a mode of processing a signal obtained by averaging output signals of the plurality of photoelectric conversion portions. Further, in the exemplary embodiments described above, the example in which the circuit performs addition of the plurality of signals read out from one pixel has been described. However, the disclosure is also applicable to a circuit that performs addition of a plurality of signals read out from a plurality of pixels being preset in different columns. Furthermore, in the exemplary embodiments described above, the switch 212 is disposed outside the pixel area 101, but the switch 212 may be disposed within the pixel area 101. Moreover, a plurality of switches 212 may be provided for each pixel row.

The photoelectric conversion apparatus 100 may have a structure (a chip lamination structure) in which a first semiconductor chip provided with a plurality of photoelectric conversion portions 202 and a second semiconductor chip provided with a plurality of readout circuits 211 are layered. Each of the first readout circuit 211-1 and the second readout circuit 211-2 in the second semiconductor chip can be a column circuit corresponding to a pixel column of the first semiconductor chip. Each of the first readout circuit 211-1 and the second readout circuit 211-2 in the second semiconductor chip can also be a matrix circuit corresponding to a pixel or pixel block of the first semiconductor chip. For connection between the first semiconductor chip and the second semiconductor chip, connection using wiring between chips by a through electrode (a through-silicon via (TSV)) or by direct bonding of metal such as copper (Cu) or connection using micro bumps between chips can be adopted. In a case where the chip lamination structure is adopted, the switch 212 can be disposed at the first semiconductor chip or can be disposed at the second semiconductor chip.

According to the exemplary embodiments, it is possible to provide a circuit arrangement that can easily change a signal readout method, in a photoelectric conversion apparatus having a plurality of photoelectric conversion portions.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-011424, filed Jan. 26, 2018, which is hereby incorporated by reference herein in its entirety.

What is claimed is:

1. A photoelectric conversion apparatus comprising:
   a plurality of photoelectric conversion portions;
   a plurality of microlenses disposed on the plurality of photoelectric conversion portions;
   a first signal line to which a first signal based on electric charges generated in a first photoelectric conversion portion among the plurality of photoelectric conversion portions is to be read out;
   a second signal line to which a second signal based on electric charges generated in a second photoelectric conversion portion among the plurality of photoelectric conversion portions is to be read out;
   a first circuit including a first input unit to which the first signal line is connected, the first circuit being configured to perform processing of amplification and/or analog-to-digital (AD) conversion of a signal input to the first input unit, with a first gain;
   a second circuit including a second input unit to which the second signal line is connected, the second circuit being configured to perform processing of amplification and/or AD conversion of a signal input to the second input unit, with a second gain different from the first gain; and
   a switch configured to perform switching between a connected state and a disconnected state between the first signal line and the second signal line, wherein the first photoelectric conversion portion and the second photoelectric conversion portion are disposed below one of the plurality of microlenses, wherein the photoelectric conversion apparatus has
a first mode in which the switch establishes the disconnected state between the first signal line and the second signal line, the first circuit processes the first signal, and the second circuit processes the second signal, and
a second mode in which the switch establishes the connected state between the first signal line and the second signal line, and the first circuit and the second circuit each process an average signal of the first signal and the second signal.

2. The photoelectric conversion apparatus according to claim 1, further comprising:
a first amplification MOS transistor, the first signal line being connected to the first photoelectric conversion portion via the first amplification MOS transistor; and
a second amplification MOS transistor, the second signal line being connected to the second photoelectric conversion portion via the second amplification MOS transistor.

3. The photoelectric conversion apparatus according to claim 1, wherein the photoelectric conversion apparatus further has a third mode in which the switch establishes the connected state between the first signal line and the second signal line, and the first circuit and the second circuit each process the first signal.

4. The photoelectric conversion apparatus according to claim 1, wherein in the first mode, the second circuit performs processing of amplification and/or AD conversion of the second signal with a third gain equal to the first gain.

5. The photoelectric conversion apparatus according to claim 1, wherein switching between the first mode and the second mode is performed frame by frame.

6. The photoelectric conversion apparatus according to claim 1, wherein switching between the first mode and the second mode is performed row by row.

7. The photoelectric conversion apparatus according to claim 1, wherein phase difference information is acquired from the first photoelectric conversion portion and the second photoelectric conversion portion.

8. The photoelectric conversion apparatus according to claim 1, further comprising a first amplification circuit and a second amplification circuit, the first amplification circuit being configured to output a signal based on electric charges generated in the first photoelectric conversion portion to the first signal line, and the second amplification circuit being configured to output a signal based on electric charges generated in the second photoelectric conversion portion to the second signal line,
wherein the switch is disposed between the first amplification circuit and the second amplification circuit and between the first circuit and the second circuit.

9. The photoelectric conversion apparatus according to claim 1,
wherein the first circuit includes an analog amplifier that performs processing of amplification with the first gain, and
wherein the second circuit includes an analog amplifier that performs processing of amplification with the second gain.

10. The photoelectric conversion apparatus according to claim 1,
wherein the first circuit includes an AD converter that performs processing of AD conversion with the first gain, and
wherein the second circuit includes an AD converter that performs processing of AD conversion with the second gain.

11. The photoelectric conversion apparatus according to claim 1,
wherein the first circuit includes an analog amplifier and an AD converter, and the first gain is an amplification gain or an AD conversion gain or both, and
wherein the second circuit includes an analog amplifier and an AD converter, and the second gain is an amplification gain or an AD conversion gain or both.

12. A system comprising:
the photoelectric conversion apparatus according to claim 1; and
at least one of an apparatus configured to process a signal output from the photoelectric conversion apparatus, and an apparatus configured to be controlled based on information obtained from the photoelectric conversion apparatus.

13. A photoelectric conversion apparatus comprising:
a first photoelectric conversion portion;
a second photoelectric conversion portion;
a first signal line to which a first signal based on electric charges generated in the first photoelectric conversion portion is to be read out;
a second signal line to which a second signal based on electric charges generated in the second photoelectric conversion portion is to be read out;
a first circuit including a first input unit to which the first signal line is connected, the first circuit being configured to perform processing of AD conversion of a signal input to the first input unit, with a first gain;
a second circuit including a second input unit to which the second signal line is connected, the second circuit being configured to perform processing of AD conversion of a signal input to the second input unit, with a second gain different from the first gain; and
a switch configured to perform switching between a connected state and a disconnected state between the first signal line and the second signal line,
wherein the photoelectric conversion apparatus has
a first mode in which the switch establishes the disconnected state between the first signal line and the second signal line, the first circuit processes the first signal, and the second circuit processes the second signal, and
a second mode in which the switch establishes the connected state between the first signal line and the second signal line, and the first circuit and the second circuit each process an average signal of the first signal and the second signal.

14. The photoelectric conversion apparatus according to claim 13, further comprising:
a first amplification MOS transistor, the first signal line being connected to the first photoelectric conversion portion via the first amplification MOS transistor; and
a second amplification MOS transistor, the second signal line being connected to the second photoelectric conversion portion via the second amplification MOS transistor.

15. The photoelectric conversion apparatus according to claim 13, wherein the photoelectric conversion apparatus further has a third mode in which the switch establishes the connected state between the first signal line and the second signal line, and the first circuit and the second circuit each process the first signal.

16. The photoelectric conversion apparatus according to claim 13, wherein in the first mode, the second circuit performs processing of AD conversion of the second signal with a third gain equal to the first gain.

17. The photoelectric conversion apparatus according to claim 13, wherein switching between the first mode and the second mode is performed frame by frame.

18. The photoelectric conversion apparatus according to claim 13, wherein switching between the first mode and the second mode is performed row by row.

19. The photoelectric conversion apparatus according to claim 13,
wherein the first circuit includes an analog amplifier and an AD converter, and
wherein the second circuit includes an analog amplifier and an AD converter.

20. A system comprising:
the photoelectric conversion apparatus according to claim 13; and
at least one of a first apparatus configured to process a signal output from the photoelectric conversion apparatus, and a second apparatus configured to be controlled based on information obtained from the photoelectric conversion apparatus.

* * * * *